United States Patent
Tan et al.

(10) Patent No.: US 8,862,957 B2
(45) Date of Patent: Oct. 14, 2014

(54) SYMBOL SELECTIVE SCALING WITH PARITY FORCING

(75) Inventors: Weijun Tan, Longmont, CO (US);
Shaohua Yang, San Jose, CA (US);
Kelly K. Fitzpatrick, Sudbury, MA (US); Xuebin Wu, San Jose, CA (US);
Fan Zhang, Milpitas, CA (US)

(73) Assignee: LSI Corporation, Milpitas, CA (US)

(*) Notice: Subject to any disclaimer, the term of this patent is extended or adjusted under 35 U.S.C. 154(b) by 138 days.

(21) Appl. No.: 13/560,737

(22) Filed: Jul. 27, 2012

(65) Prior Publication Data
US 2014/0032989 A1 Jan. 30, 2014

(51) Int. Cl.
*H03M 13/00* (2006.01)
*H03M 13/05* (2006.01)
*H04B 15/00* (2006.01)

(52) U.S. Cl.
CPC ............ *H03M 13/05* (2013.01); *H04B 15/00* (2013.01)
USPC ...... 714/752; 714/800; 714/799; 714/E11.03; 375/229; 375/346; 708/322; 708/323; 708/506

(58) Field of Classification Search
CPC ........ H03M 13/05; G06F 11/10; G06F 11/07; G06K 7/10722; G06K 7/10851; G06K 7/14; G06K 7/1456; H04L 1/0002; H04L 25/03019; H04L 25/03197; H04L 25/03292; H04L 25/03318; H04L 25/03343; H04L 5/0023
USPC .................. 714/800, 755, 786, E11.032, 752; 714/E11.024, 799; 375/229, 346; 370/344; 455/101; 708/322, 323, 506
See application file for complete search history.

(56) References Cited

U.S. PATENT DOCUMENTS

| | | | |
|---|---|---|---|
| 5,483,529 A * | 1/1996 | Baggen et al. | 370/484 |
| 5,701,314 A | 12/1997 | Armstrong | |
| 5,712,861 A | 1/1998 | Inoue | |
| 6,438,717 B1 | 8/2002 | Butler | |
| 6,657,803 B1 | 12/2003 | Ling | |
| 7,136,244 B1 | 11/2006 | Rothberg | |
| 7,653,127 B2 * | 1/2010 | Brunn et al. | 375/232 |
| 7,702,989 B2 | 4/2010 | Graef et al. | |
| 7,730,384 B2 | 6/2010 | Graef et al. | |
| 7,738,201 B2 | 6/2010 | Jin et al. | |
| 7,971,125 B2 | 6/2011 | Graef et al. | |
| 7,990,642 B2 | 8/2011 | Lee et al. | |
| 8,121,220 B1 * | 2/2012 | Shi et al. | 375/316 |
| 8,176,404 B2 | 5/2012 | Yang et al. | |
| 8,406,333 B2 * | 3/2013 | Kwon et al. | 375/267 |
| 8,615,053 B2 * | 12/2013 | Wallace et al. | 375/267 |
| 2011/0080211 A1 | 4/2011 | Yang | |
| 2011/0161633 A1 | 6/2011 | Xu | |
| 2012/0200954 A1 | 8/2012 | Jin | |
| 2012/0236429 A1 | 9/2012 | Yang | |

OTHER PUBLICATIONS

Olmos et al., "Tree-Structure Expectation Propagation for LDPC Decoding in Erasure Channels", Cornell University Library arXiv:1009.4287 (Sep. 22, 2010).

(Continued)

*Primary Examiner* — Guy Lamarre
(74) *Attorney, Agent, or Firm* — Hamilton DeSanctis & Cha

(57) ABSTRACT

The present inventions are related to systems and methods for data processing, and more particularly to systems and methods for data processing systems with symbol selective scaling interacting with parity forcing.

20 Claims, 4 Drawing Sheets

(56) References Cited

OTHER PUBLICATIONS

U.S. Appl. No. 13/326,363, filed Dec. 15, 2011, Fan Zhang, Unpublished.

U.S. Appl. No. 13/490,849, filed Jun. 7, 2012, Johnson Yen, Unpublished.

U.S. Appl. No. 13/465,214, filed May 7, 2012, Chung-Li Wang, Unpublished.

U.S. Appl. No. 13/412,492, filed Mar. 5, 2012, Shaohua Yang, Unpublished.

U.S. Appl. No. 13/445,858, filed Apr. 12, 2012, Johnson Yen, Unpublished.

U.S. Appl. No. 13/474,672, filed May 17, 2012, Fan Zhang, Unpublished.

U.S. Appl. No. 13/459,282, filed Apr. 30, 2012, Fan Zhang, Unpublished.

U.S. Appl. No. 13/372,600, filed Feb. 14, 2012, Shaohua Yang, Unpublished.

U.S. Appl. No. 13/326,367, filed Dec. 15, 2011, Shaohua Yang, Unpublished.

U.S. Appl. No. 13/483,982, filed May 30, 2012, Yang Han, Unpublished.

\* cited by examiner

US 8,862,957 B2

SYMBOL SELECTIVE SCALING WITH PARITY FORCING

BACKGROUND

The present invention is related to systems and methods for processing data, and more particularly to systems and methods for scaling in a data processing system.

Data processing systems often include one or more data detector circuits and data decoder circuits. The output of each of the circuits may be fed to another of the circuits for additional processing. In some cases, the additional processing does not converge on a desired result, and in some cases may diverge from a desired result. In such cases, data processing performance may be dramatically reduced.

Hence, for at least the aforementioned reasons, there exists a need in the art for advanced systems and methods for data processing.

BRIEF SUMMARY

The present invention is related to systems and methods for processing data, and more particularly to systems and methods for symbol selective scaling in a data processing system in interaction with parity forcing techniques. The symbol selective scaling may be dynamically enabled based on global iteration number and parity forcing conditions. The symbol selective scaling may be enabled immediately for large data blocks with a relatively low number of available global processing iterations or after a number of global iterations for smaller data blocks with a greater number of available global processing iterations. Symbol selective scaling is applied in all parity forcing modes, and the scaling method may be alternated on consecutive global iterations.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for processing data, and more particularly to systems and methods for symbol selective scaling in a data processing system in interaction with parity forcing techniques. As one example application, when the a priori log likelihood ratio (LLR) values and the extrinsic LLR values of a symbol channel detector have different hard decisions, the performance of a downstream low density parity check (LDPC) decoder suffers. Applying symbol selective scaling to scale down the extrinsic LLRs improves decoding performance. By applying symbol selective scaling interactively with the parity forcing mode in the symbol channel detector, performance is improved at both low and high signal to noise ratios (SNRs).

The symbol selective scaling disclosed herein may be dynamically enabled based on global iteration number and parity forcing conditions. For example, the symbol selective scaling may be enabled either immediately when processing a data sector or after a number of global processing iterations have been completed on the data sector. Symbol selective scaling is applied in all parity forcing modes, and the scaling method may be alternated on consecutive global iterations.

Figure 1:
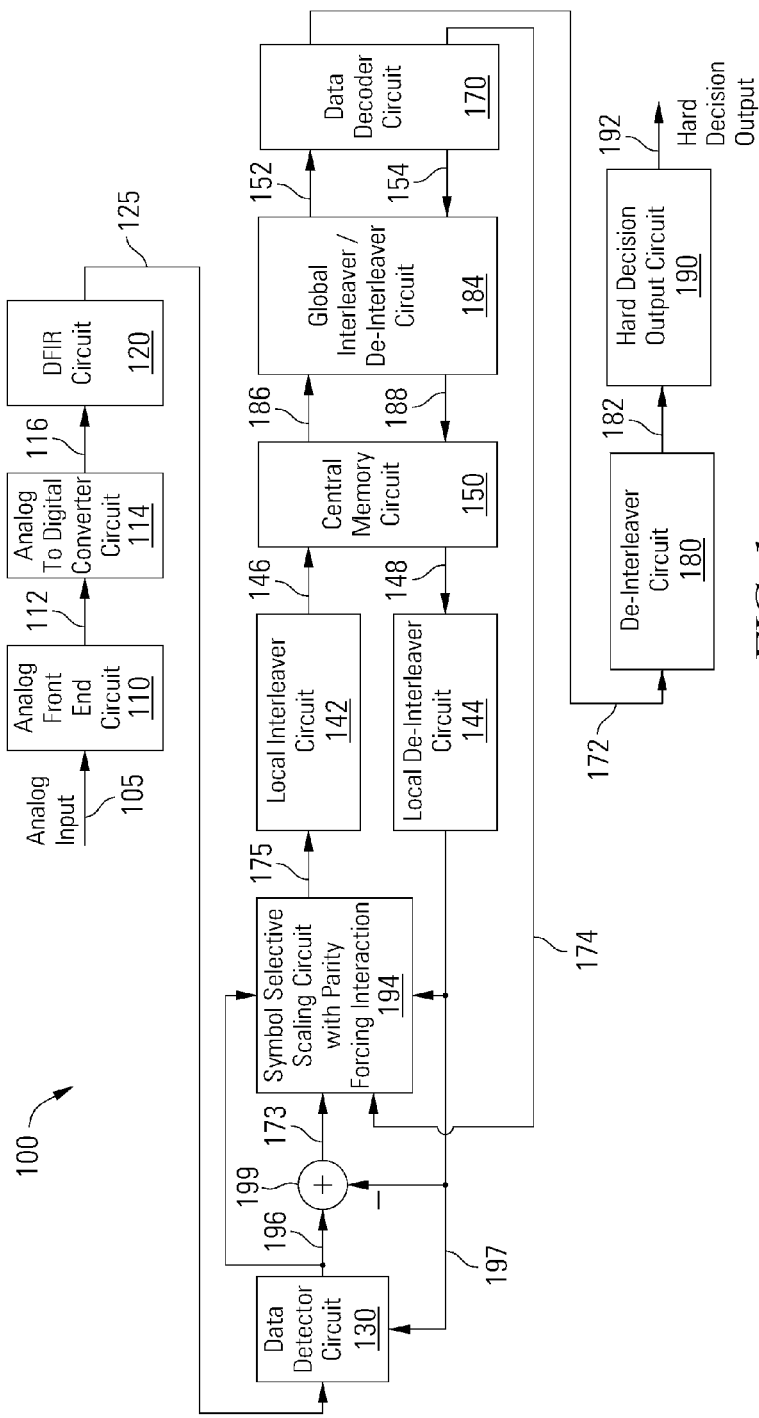
FIG. 1 depicts a data processing circuit including symbol selective scaling circuitry with parity forcing interaction in accordance with some embodiments of the present invention.

Turning to FIG. 1, a data processing circuit 100 is shown that includes symbol selective scaling circuitry that is operable to selectively scale a data detector output on a symbol by symbol basis and to interact with parity forcing schemes. Data processing circuit 100 includes an analog front end circuit 110. Analog front end circuit 110 may include, but is not limited to, an analog filter and an amplifier circuit as are known in the art. Based upon the disclosure provided herein, one of ordinary skill in the art will recognize a variety of circuitry that may be included as part of analog front end circuit 110. In some cases, the gain of a variable gain amplifier included as part of analog front circuit 110 may be modifiable, and the cutoff frequency and boost of an analog filter included in analog front end circuit 110 may be modifiable. Analog front end circuit 110 receives and processes an analog signal 105, and provides a processed analog signal 112 to an analog to digital converter circuit 114. In some cases, analog signal 105 is derived from a read/write head assembly (not shown) that is disposed in relation to a storage medium (not shown). In other cases, analog signal 105 is derived from a receiver circuit (not shown) that is operable to receive a signal from a transmission medium (not shown). The transmission medium may be wireless or wired such as, but not limited to, cable or optical connectivity. Based upon the disclosure provided herein, one of ordinary skill in the art will recognize a variety of sources from which analog input 105 may be derived.

Analog to digital converter circuit 114 converts processed analog signal 112 into a corresponding series of digital samples 116. Analog to digital converter circuit 114 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 116 are provided to an equalizer circuit 120. Equalizer circuit 120 applies an equalization algorithm to digital samples 116 to yield an equalized output 125. In some embodiments of the present invention, equalizer circuit 120 is a digital finite impulse response filter circuit as are known in the art. Equalized output 125 is provided to a data detector circuit 130. In some cases, equalizer 120 includes sufficient memory to maintain one or more codewords until a data detector circuit 130 is available for processing.

Data detector circuit 130 is operable to apply a data detection algorithm to a received codeword or data set, and in some cases data detector circuit 130 can process two or more codewords in parallel. The received codeword or data set includes a number of multi-bit symbols. In one particular embodiment of the present invention, the multi-bit symbols are two bit symbols that include four values for each two bit symbol (i.e., '00', '01', '10', '11'). In such a case, a detected output 196 from data detector circuit 130 includes four soft decision values (L0 corresponding to a likelihood that '00' is the appropriate hard decision, L1 corresponding to a likelihood that '01' is the appropriate hard decision, L2 corresponding to a likelihood that '10' is the appropriate hard decision, and L3 corresponding to a likelihood that '11' is the appropriate hard decision). In another embodiment of the present invention, the multi-bit symbols are three bit symbols that include eight values for each three bit symbol (i.e., '000', '001', '010', '011', '100', '101', '110', '111'). In such a case, detected output 196 from data detector circuit 130 includes four soft decision values (L0 corresponding to a likelihood that '000' is the appropriate hard decision, L1 corresponding to a likelihood that '001' is the appropriate hard decision, L2 corresponding to a likelihood that '010' is the appropriate hard decision, L3 corresponding to a likelihood that '011' is the appropriate hard decision, L4 corresponding to a likelihood that '100' is the appropriate hard decision, L5 corresponding to a likelihood that '101' is the appropriate hard decision, L6 corresponding to a likelihood that '110' is the appropriate hard decision, L7 corresponding to a likelihood that '111' is the appropriate hard decision). Based upon the disclosure provided herein, one of ordinary skill in the art will recognize a number of different symbol sizes that may be used in relation to different embodiments of the present invention.

In some embodiments of the present invention, data detector circuit 130 is a Viterbi algorithm data detector circuit as are known in the art. In other embodiments of the present invention, data detector circuit 130 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 130 is started based upon availability of a data set from equalizer circuit 120 or from a central memory circuit 150.

Upon completion, data detector circuit 130 provides detector output 196 to a summation circuit 199 that subtracts de-interleaved output 197 on a symbol by symbol basis to yield a symbol output 173. Symbol output 173 is provided to a symbol selective scaling circuit with parity forcing interaction 194 that selectively scales one or more symbols within symbol output 173 based in part on de-interleaved output 197. Symbol selective scaling circuit with parity forcing interaction 194 provides a series of selectively scaled symbols as a scaled detected output 175 to a local interleaver circuit 142. Symbol selective scaling circuit with parity forcing interaction 194 may be enabled after a given number of global processing iterations, and interacts with the parity forcing mode in some embodiments to improve gain at both low and high SNRs. In some embodiments of the present invention, symbol selective scaling circuit 194 may perform the scaling to yield scaled detected output 175 generally in accordance with the following pseudo-code based upon two bit symbols and a comparison of symbol output 173 with de-interleaved output 197:

```
For (i=0 to END OF CODEWORD) /* for each symbol of symbol
output 173 */
    {
    If (ArgMax(L0, L1, L2, L3) of de-interleaver output 197 NOT
EQUAL to ArgMax(L0, L1, L2, L3) of symbol output 173)
        {
        /* Scale the selected symbol */
        L0 of scaled detected output [i] 175 = L0 of symbol output
            173 [i] * SCALAR;
        L1 of scaled detected output [i] 175 = L1 of symbol output
            173 [i] * SCALAR;
        L2 of scaled detected output [i] 175 = L2 of symbol output
            173 [i] * SCALAR;
        L3 of scaled detected output [i] 175 = L3 of symbol output
            173 [i] * SCALAR
        }
    Else
        {
        /* Do not scale the selected symbol */
        L0 of scaled detected output [i] 175 = L0 of symbol output 173 [i];
        L1 of scaled detected output [i] 175 = L1 of symbol output 173 [i];
        L2 of scaled detected output [i] 175 = L2 of symbol output 173 [i];
        L3 of scaled detected output [i] 175 = L3 of symbol output 173 [i]
        }
    }
```

In the aforementioned pseudo-code, the function "Arg-Max" returns a pointer indicating which of the values L0-L3 was the highest. Thus, the comparison of ArgMax of symbol output 173 [i] with de-interleaver output 197 [i] compares whether the same symbol (one of L0-L3) is returned for both symbol output 173 and de-interleaver output 197. Of note, the preceding pseudo-code may be expanded for use in relation to symbols of three or more bits. The value of SCALAR may be fixed, or may be user programmable. In one particular embodiment of the present invention, the value of SCALAR is 0.5.

In other embodiments of the present invention, symbol selective scaling circuit with parity forcing interaction 194 may perform the scaling to yield scaled detected output 175 in accordance with the following pseudo-code based upon two bit symbols and a comparison of symbol output 173 with detected output 196:

```
For (i=0 to END OF CODEWORD) /* for each symbol of symbol
output 173 */
    {
    If (ArgMax(L0, L1, L2, L3) of detected output 196 [i] NOT
EQUAL to ArgMax(L0, L1, L2, L3) of symbol output 173 [i])
        {
        /* Scale the selected symbol */
        L0 of scaled detected output [i] 175 = L0 of symbol output
```

```
        173 [i] * SCALAR;
    L1 of scaled detected output [i] 175 = L1 of symbol output
        173 [i] * SCALAR;
    L2 of scaled detected output [i] 175 = L2 of symbol output
        173 [i] * SCALAR;
    L3 of scaled detected output [i] 175 = L3 of symbol output
        173 [i] * SCALAR
    }
    Else
    {
        /* Do not scale the selected symbol */
        L0 of scaled detected output [i] 175 = L0 of symbol output 173 [i];
        L1 of scaled detected output [i] 175 = L1 of symbol output 173 [i];
        L2 of scaled detected output [i] 175 = L2 of symbol output 173 [i];
        L3 of scaled detected output [i] 175 = L3 of symbol output 173 [i]
    }
}
```

Again, the function "ArgMax" returns a pointer indicating which of the values L0-L3 was the highest. Thus, the comparison of ArgMax of symbol output 173 [i] with detected output 196 [i] compares whether the same symbol (one of L0-L3) is returned for both symbol output 173 and detected output 196.

In the aforementioned embodiments, the scaling is performed on all of the symbols for a particular instance (i.e., [i]) of symbol output 173 (i.e., all of L0-L3 are scaled). In other embodiments of the present invention, only the soft data of symbol output 173 having the maximum value in detected output 196 is scaled (i.e., only one of L0-L3 having the maximum value is scaled). Assume the symbol output 173 that has the maximum value in detected output 196 is A, and that in symbol output 173 it is B. Where A is not equal to B, then in one case all symbols in symbol output 173 are scaled, while in another case, only symbol A in symbol output 173 is scaled.

Local interleaver circuit 142 shuffles sub-portions (i.e., local chunks) of scaled detected output 175 to yield an interleaved codeword 146 that is stored to central memory circuit 150. Local interleaver circuit 142 may be any circuit known in the art that is capable of shuffling data sets to yield a re-arranged data set.

Once data decoder circuit 170 is available, a previously stored interleaved codeword 146 is accessed from central memory circuit 150 as a decoder input 152 via a global interleaver/de-interleaver circuit 184. In particular, global interleaver/de-interleaver circuit 184 performs a global data shuffling on a data set 186 retrieved from central memory circuit 150 to yield a decoder input 152. Data decoder circuit 170 applies a data decode algorithm to decoder input 152 to yield a decoded output. In some embodiments of the present invention, the data decode algorithm is a non-binary low density parity check algorithm as are known in the art. Based upon the disclosure provided herein, one of ordinary skill in the art will recognize other decode algorithms that may be used in relation to different embodiments of the present invention. As the data decode algorithm completes on a given data set, it is determined whether the decoded output converged (i.e., the resulting data set matches the originally written data set as indicated by the lack of parity errors). Where it is determined that the decoded output converged, the resulting decoded data set is provided as a hard decision output 172 to a de-interleaver circuit 180. De-interleaver circuit 180 rearranges the data to reverse both the global and local interleaving applied to the data to yield a de-interleaved output 182. De-interleaved output 182 is provided to a hard decision output circuit 190. Hard decision output circuit 190 is operable to re-order data sets that may complete out of order back into their original order. The originally ordered data sets are then provided as a hard decision output 192.

Alternatively, where it is determined that the data decode algorithm failed to converge (i.e., there are remaining parity errors), a completed data set 154 is globally de-interleaved by global interleaver/de-interleaver circuit 184 which reverses the earlier applied global interleaving (i.e., shuffling) to yield a de-interleaved output 188. De-interleaved output 188 is stored to central memory circuit 150. In addition, a number of violated checks 174 (i.e., the number of remaining parity errors in completed data set 154) is provided to symbol selective scaling circuit with parity forcing interaction 194 for use in controlling the symbol selective scaling and parity forcing operation.

Once data detector circuit 130 is available, a previously stored decoder output 148 is accessed from central memory circuit 150 and locally de-interleaved by a local de-interleaver circuit 144. Local de-interleaver circuit 144 re-arranges decoder output 148 to reverse the shuffling originally performed by local interleaver circuit 142. A resulting de-interleaved output 197 is provided to data detector circuit 130.

Figure 2:
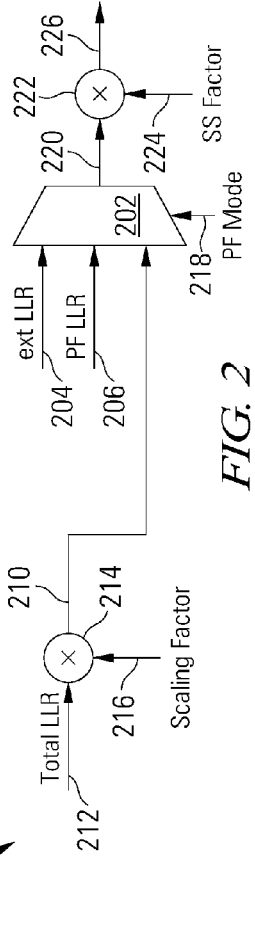
FIG. 2 depicts a symbol selective scaling circuit with parity forcing interaction in accordance with some embodiments of the present invention.

Turning to FIG. 2, a symbol selective scaling circuit with parity forcing interaction 200 is shown in accordance with some embodiments of the present invention. The symbol selective scaling circuit with parity forcing interaction 200 generates data to be used as decoder input (e.g., as scaled detected output 175 that may be further interleaved before decoding) at output 226. Based at least in part on factors such as the number of global iterations previously completed for a data sector, which may be used to disable symbol selective scaling, and on the parity forcing mode 218, the symbol selective scaling circuit with parity forcing interaction 200 bases the data at output 226 on the total LLR values 212 (corresponding to detected output 196 from data detector circuit 130), on the extrinsic LLR values 204 (corresponding to symbol output 173, which equals the total LLR values 196 minus the a priori LLR values 197 in the soft output from decoder 170), or on parity forcing LLR values 206 (corresponding to the number of violated checks 174 multiplied by a constant such as but not limited to −2 or 2). The total LLR values 212 may be scaled in multiplier 214 by a scaling factor 216, yielding scaled total LLR values 210. Multiplexer 202 selects either extrinsic LLR values 204, parity forcing LLR values 206, or scaled total LLR values 210 as multiplexer output 220, based on the parity forcing mode 218. The multiplexer output 220 may have symbol selective scaling applied in multiplier 222, with the scaling factor 224 being either programmable or fixed, to yield the output 226. The output 226 may be further processed, for example applying a saturation function or ceiling function to limit the number of bits.

The parity forcing mode 218 is determined in some embodiments based on the number of violated checks (e.g., 174) reported by the decoder circuit (e.g., 170) in a previous global iteration, compared with a first, larger threshold and a second, smaller threshold. If the number of violated checks is greater than threshold 1, the parity forcing mode 218 is mode 0. If the number of violated checks is less than threshold 2, the parity forcing mode 218 is mode 1. If the number of violated checks is between threshold 1 and threshold 2, the parity forcing mode 218 is mode 2.

In some embodiments, when the number of violated checks indicates parity forcing mode 0, the symbol selective scaling circuit with parity forcing interaction 200 alternates in consecutive global iterations between using symbol selective scaling applied by multiplier 222 to extrinsic LLR values 204, for example with a scaling factor 224 of 0.5, and using scaled total LLR values 212, for example scaled in multiplier 214 by a scaling factor 216 of 0.25 and in multiplier 222 by a scaling factor 224 of 0.5. When the number of violated checks indicates parity forcing mode 1, the symbol selective scaling circuit with parity forcing interaction 200 alternates in consecutive global iterations between using the parity forcing LLR values 206, for example generated as −2 multiplied by the number of violated checks, and using the scaled total LLR values 210. When the number of violated checks indicates parity forcing mode 1, the symbol selective scaling circuit with parity forcing interaction 200 uses the scaled total LLR values 210, for example with the scaling factor 216 set at 0.25.

Symbol selective scaling is thus applied in all parity forcing modes, and at least some of the parity forcing modes are alternated between successive global iterations. Application of symbol selective scaling may be delayed until after a number of global iterations have been completed for a data sector. The number of global iterations to complete before enabling symbol selective scaling may be programmable in some embodiments, for example by setting a value in a register. Parity forcing may also be selectively disabled.

Figure 3:
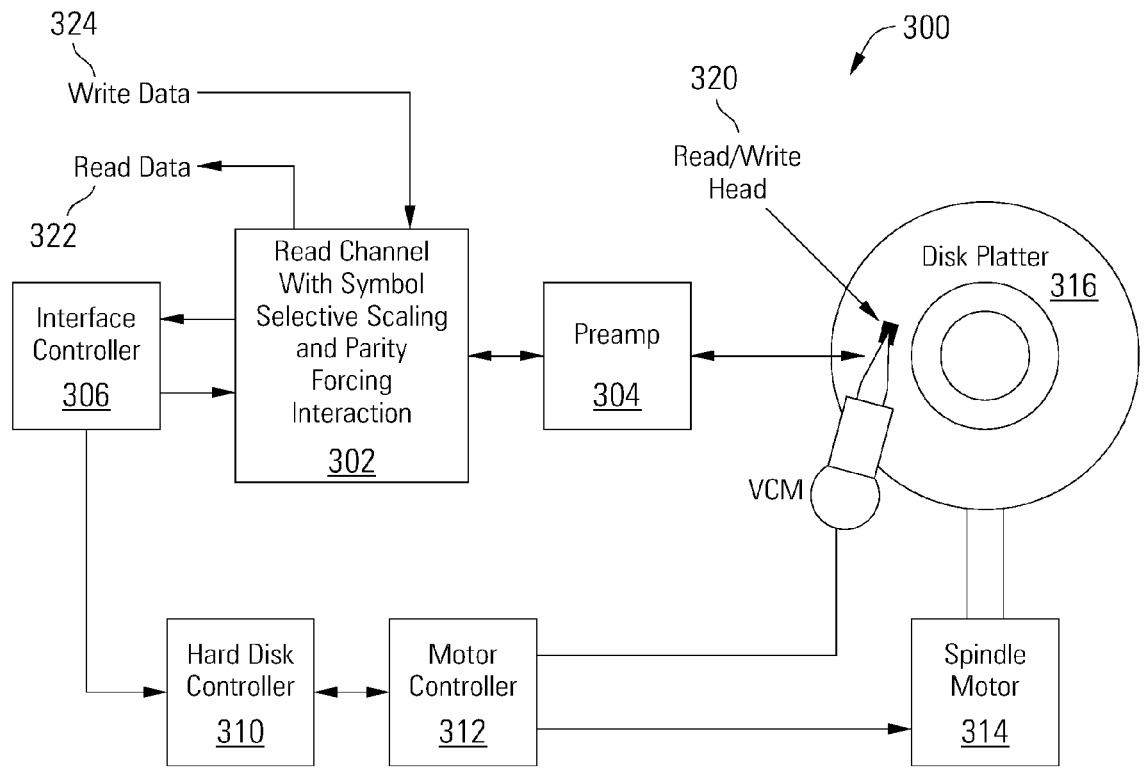
FIG. 3 shows a storage system including symbol selective scaling circuitry with parity forcing interaction in accordance with some embodiments of the present invention.

Turning to FIG. 3, a storage system 300 including a read channel circuit 302 having a symbol selective scaling circuit with parity forcing interaction is shown in accordance with various embodiments of the present invention. Storage system 300 may be, for example, a hard disk drive. Storage system 300 also includes a preamplifier 304, an interface controller 306, a hard disk controller 310, a motor controller 312, a spindle motor 314, a disk platter 316, and a read/write head 320. Interface controller 306 controls addressing and timing of data to/from disk platter 316. The data on disk platter 316 consists of groups of magnetic signals that may be detected by read/write head assembly 320 when the assembly is properly positioned over disk platter 316. In one embodiment, disk platter 316 includes magnetic signals recorded in accordance with either a longitudinal or a perpendicular recording scheme.

In a typical read operation, read/write head assembly 320 is accurately positioned by motor controller 312 over a desired data track on disk platter 316. Motor controller 312 both positions read/write head assembly 320 in relation to disk platter 316 and drives spindle motor 314 by moving read/write head assembly to the proper data track on disk platter 316 under the direction of hard disk controller 310. Spindle motor 314 spins disk platter 316 at a determined spin rate (RPMs). Once read/write head assembly 320 is positioned adjacent the proper data track, magnetic signals representing data on disk platter 316 are sensed by read/write head assembly 320 as disk platter 316 is rotated by spindle motor 314. The sensed magnetic signals are provided as a continuous, minute analog signal representative of the magnetic data on disk platter 316. This minute analog signal is transferred from read/write head assembly 320 to read channel circuit 302 via preamplifier 304. Preamplifier 304 is operable to amplify the minute analog signals accessed from disk platter 316. In turn, read channel circuit 302 decodes and digitizes the received analog signal to recreate the information originally written to disk platter 316. This data is provided as read data 322 to a receiving circuit. A write operation is substantially the opposite of the preceding read operation with write data 324 being provided to read channel circuit 302. This data is then encoded and written to disk platter 316.

During operation, the symbol selective scaling circuitry with parity forcing interaction may scale one or more symbols of a given codeword depending upon various conditions in an effort to improve data processing performance. Such symbols may be two or more bits. In some cases, read channel circuit 302 may be implemented to include a symbol selective scaling circuit with parity forcing interaction similar to that disclosed in relation to FIGS. 1-2. Further, the symbol selective scaling with parity forcing interaction may be accomplished consistent with one of the approaches disclosed in relation to FIGS. 5-6.

It should be noted that storage system 300 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 300, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 302 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 4:
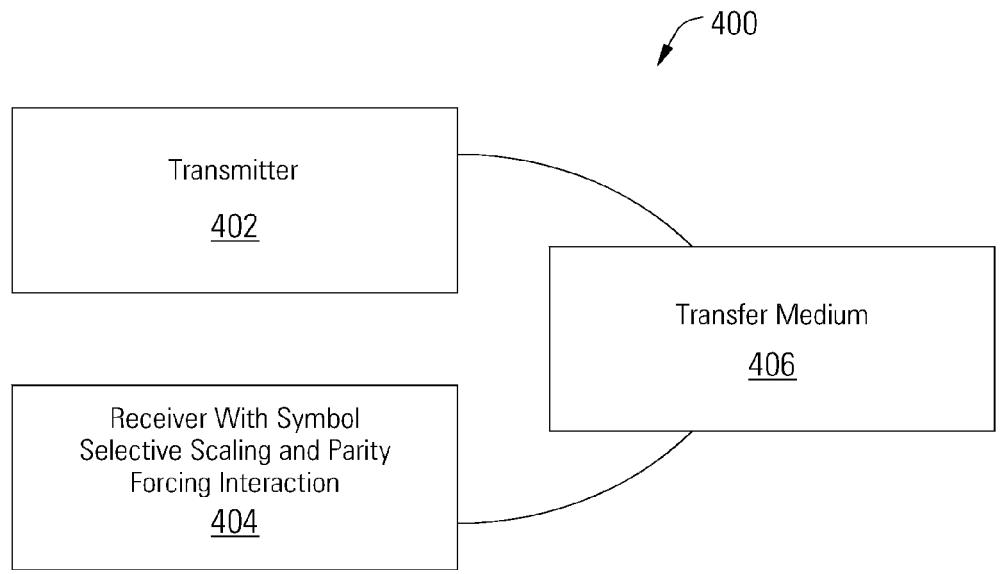
FIG. 4 depicts a communication system including symbol selective scaling circuitry with parity forcing interaction in accordance with some embodiments of the present invention.

Turning to FIG. 4, a data transmission system 400 including a receiver 402 having a symbol selective scaling circuit with parity forcing interaction is shown in accordance with various embodiments of the present invention. Data transmission system 400 includes a transmitter 402 that is operable to transmit encoded information via a transfer medium 406 as is known in the art. The encoded data is received from transfer medium 406 by a receiver 404. Receiver 404 processes the received input to yield the originally transmitted data. As part of processing the received information, receiver 404 applies symbol selective scaling with parity forcing interaction. In some cases, receiver 404 may be implemented to include a symbol selective scaling circuit with parity forcing interaction similar to that disclosed in relation to FIGS. 1-2. Further, the symbol selective scaling with parity forcing interaction may be accomplished consistent with one of the approaches disclosed in relation to FIGS. 5-6.

Figure 5:
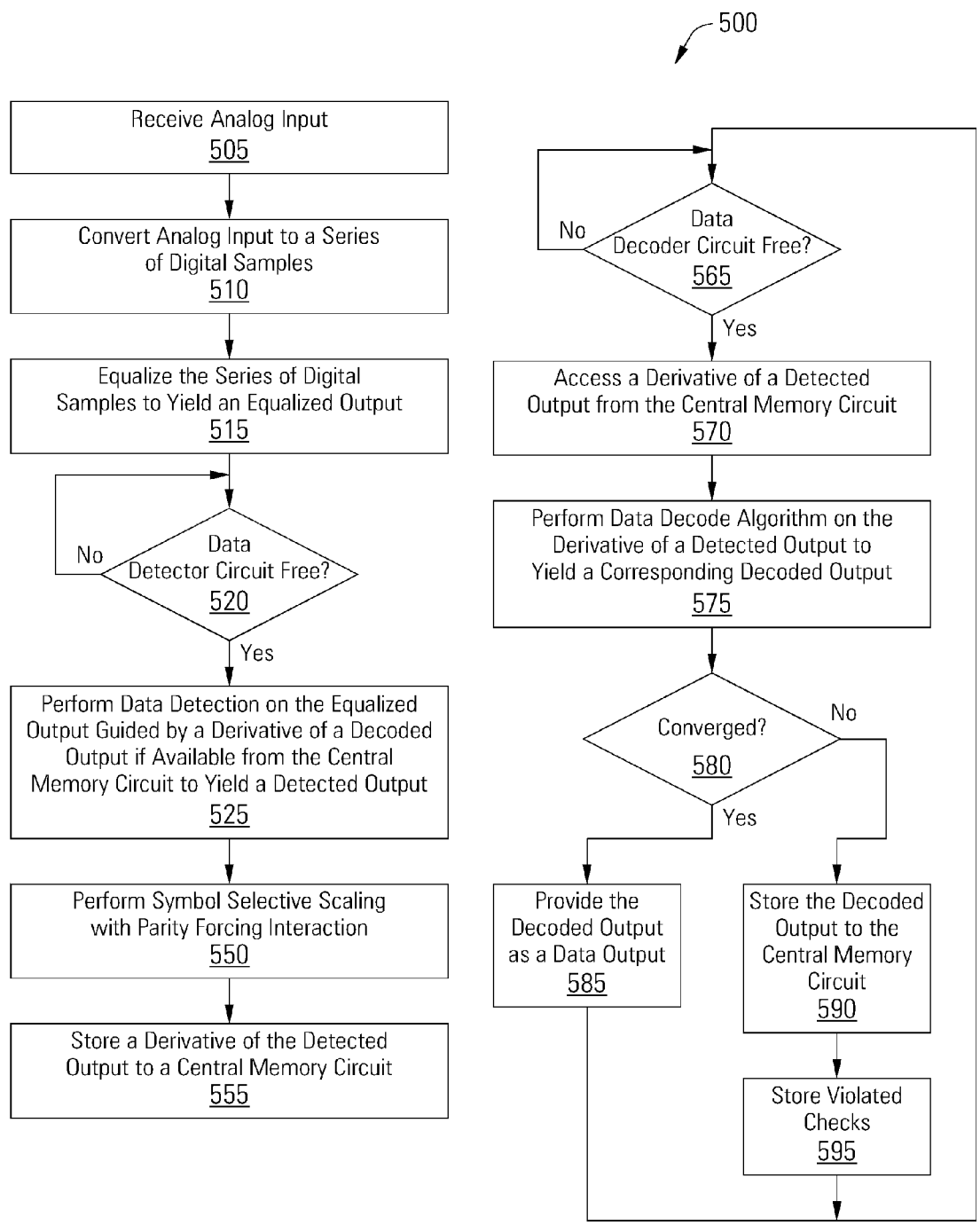
FIG. 5 is a flow diagram showing a method for detecting and decoding data including symbol selective scaling with parity forcing interaction in accordance with some embodiments of the present invention.

Turning to FIG. 5, a flow diagram 500 shows a method for symbol selective scaling with parity forcing interaction in accordance with various embodiments of the present invention. Following flow diagram 500, an analog input signal is received (block 505). The analog input may be derived from, for example, a storage medium or a data transmission channel. Based upon the disclosure provided herein, one of ordinary skill in the art will recognize a variety of sources of the analog input. The analog input is converted to a series of digital samples (block 510). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 515). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention.

It is determined whether a data detector circuit is available (block 520). Where a data detector circuit is available (block 520), a data detection algorithm is applied to the equalized output guided by a de-interleaved codeword (i.e., a derivative of a decoded output) where such a de-interleaved codeword corresponding to the equalized output is available (i.e., the second and later iterations through the data detector circuit and the data decoder circuit). This process yields a detected output (block 525). In some embodiments of the present invention, data detection algorithm is a Viterbi algorithm as are known in the art. In other embodiments of the present invention, the data detection algorithm is a maximum a posteriori data detector circuit as are known in the art.

Symbol selective scaling with parity forcing interaction is performed (block 550), for example either based either on the detected output (total LLR values), or extrinsic LLR values, or parity forced LLR values to generate LLR values as decoder inputs.

A derivative of the detected output is stored to a central memory circuit (block 555). In some cases, the derivative of the detected output is a locally interleaved version of the detected output.

In parallel to the previously discussed processing, it is determined whether a data decoder circuit is available (block 565). Where the data decoder circuit is available (block 565) a previously stored derivative of the detected output is accessed from the central memory (block 570). A decode algorithm is applied to the accessed derivative of the detected output to yield a corresponding decoded output (block 575). In some embodiments of the present invention, the data decode algorithm is a non-binary low density parity check algorithm as are known in the art. Based upon the disclosure provided herein, one of ordinary skill in the art will recognize other decode algorithms that may be used in relation to different embodiments of the present invention. It is determined whether the decode algorithm converged (i.e., the original data set is identified) (block 580). Where the data decode algorithm converged (block 580), the decoded output is provided as a data output (block 585). Otherwise, where the data decode algorithm failed to converge (block 580), the decoded output (or a derivative of the decoded output such as, for example, a globally de-interleaved version of the decoded output) is stored back to the central memory circuit for a subsequent global iteration (i.e., processing through both the data detection algorithm and the data decode algorithm) (block 590). In addition, the number of remaining violated checks (i.e., the number of remaining parity check equations that are not correct) is stored for use in relation to block 550 (block 595).

Figure 6:
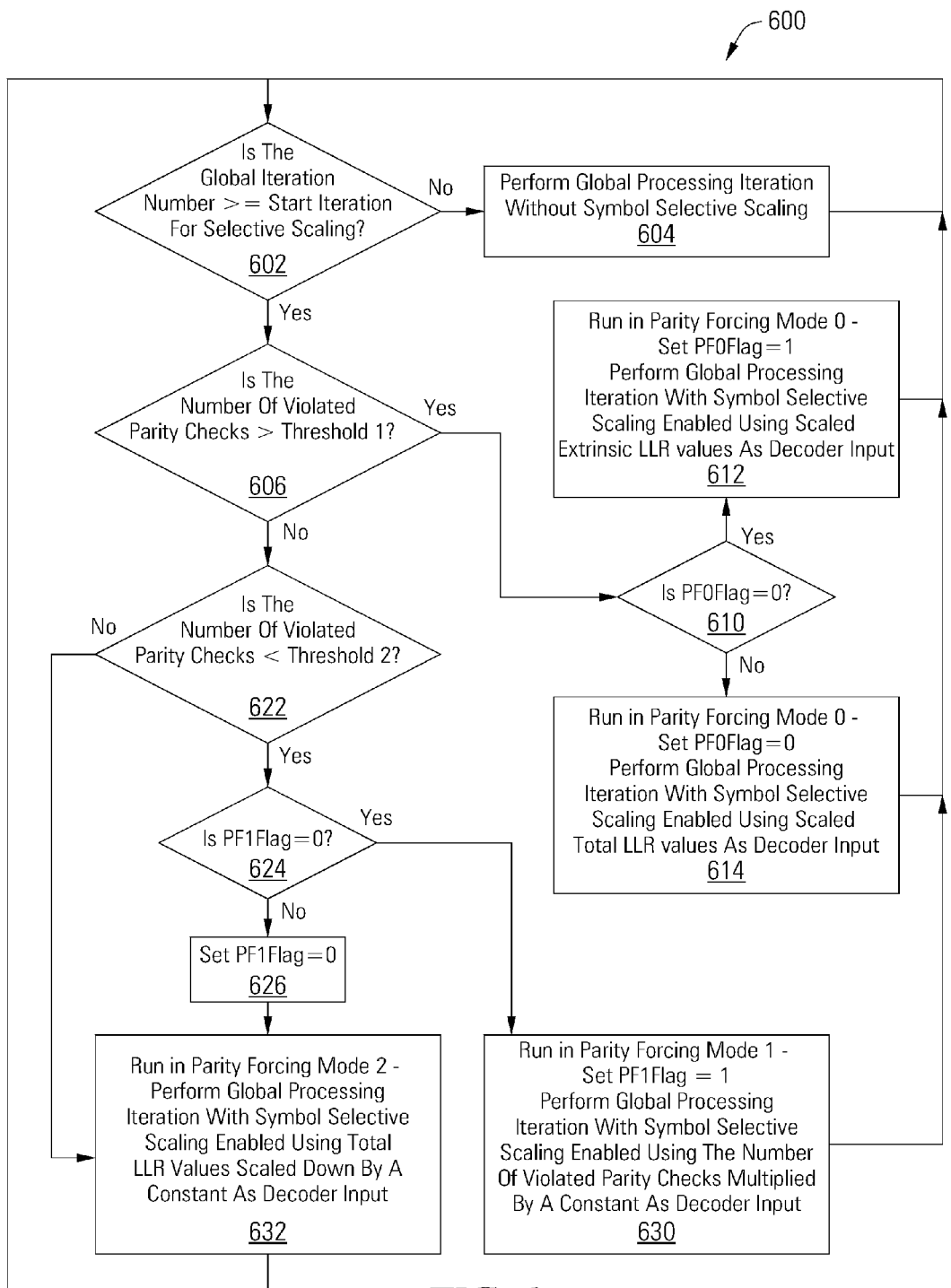
FIG. 6 is a flow diagram showing a method for symbol selective scaling with parity forcing interaction in accordance with some embodiments of the present invention.

Turning to FIG. 6, a flow diagram 600 shows a method for symbol selective scaling with parity forcing interaction in accordance with some embodiments of the present invention. It is determined whether the current global iteration number for a data sector being processed is greater than a starting iteration number for symbol selective scaling (block 602). For example, in some embodiments, for small data sectors with a relatively large number of allowed global iterations, the starting iteration number may be set at half the number of allowed global iterations, and for larger data sectors with a smaller number of allowed global iterations, the starting iteration number may be set at 0 to apply symbol selective scaling immediately. Where the current global iteration number is less than the starting iteration number (block 602), the global processing iteration is performed without symbol selective scaling (block 604). Where the current global iteration number is greater than (or equal to) the starting iteration number (block 602), it is determined whether the number of violated parity checks is greater than a first threshold (block 606).

Where the number of violated parity checks is greater than a first threshold (block 606), the symbol selective scaling with parity forcing interaction operates in parity forcing mode 0, alternating between symbol selective scaling and scaled total LLR in successive global iterations. A PF0Flag value is stored, for example in a register, to differentiate between successive global iterations to enable this alternating treatment. In other embodiments, successive global iterations may be differentiated in other ways. In yet other embodiments, such alternating treatment is omitted.

In this example embodiment, it is determined whether the value of a stored flag PF0Flag equals zero (block 610). If PF0Flag equals zero (block 610), the PF0Flag is set to one and the symbol selective scaling with parity forcing interaction operates in parity forcing mode 0, performing the global processing iteration with symbol selective scaling enabled, using scaled extrinsic LLR values as the decoder input. Symbols to be scaled may be selected, for example, by a symbol-by-symbol comparison between either a soft detector input or a soft detector output and an extrinsic output, determining for example whether the current instance ([i]) of the soft output is equal to the corresponding instance ([i]) of the extrinsic output (e.g., 173). Using data processing circuit 100 as an example, the soft output corresponds to detected output 196, and the extrinsic output corresponds to symbol output 173. Where the two instances are not equal, the symbol corresponding to the particular instance ([i]) is scaled and subsequently stored to the central memory circuit. In some embodiments of the present invention, the scaling is done to all values for a given symbol. Thus, for example, where two bit symbols having four values, L0-L3, for each symbol (L0 corresponding to a likelihood that '00' is the appropriate hard decision, L1 corresponding to a likelihood that '01' is the appropriate hard decision, L2 corresponding to a likelihood that '10' is the appropriate hard decision, and L3 corresponding to a likelihood that '11' is the appropriate hard decision), the symbol scaling may be done in accordance with the following pseudo-code:

L0 of a scaled output [i]=L0 of extrinsic output [i]*SCALAR;
L1 of a scaled output [i]=L1 of extrinsic output [i]*SCALAR;
L2 of a scaled output [i]=L2 of extrinsic output [i]*SCALAR;

L3 of a scaled output [i]=L3 of extrinsic output [i]*SCALAR;

Of note, the preceding pseudo-code may be expanded for use in relation to symbols of three or more bits. The value of SCALAR may be fixed, or may be user programmable. In one particular embodiment of the present invention, the value of SCALAR is 0.5. In the preceding embodiment of the present invention, the scaling is performed on all of the symbols for a particular instance ([i]). In other embodiments of the present invention, only the soft data of symbol having the maximum value is scaled (i.e., only one of L0-L3 having the maximum value is scaled).

Where PF0Flag does not equal zero (block 610), the PF0Flag is set to zero and the symbol selective scaling with parity forcing interaction operates in parity forcing mode 0, performing the global processing iteration with symbol selective scaling enabled, using scaled total LLR values as the decoder input (block 614).

Where the number of violated parity checks is not greater than a first threshold (block 606), it is determined whether the number of violated parity checks is less than a second threshold (block 622), where the first threshold is greater than the second threshold. If the number of violated parity checks is not less than the second threshold (block 622), the selective scaling with parity forcing interaction operates in parity forcing mode 2, performing the global processing iteration with symbol selective scaling enabled, using total LLR values scaled down by a constant as the decoder input (block 632). In some embodiments, the total LLR values are scaled by 0.25 in parity forcing mode 2.

Where the number of violated parity checks is less than the second threshold (block 622), the selective scaling with parity forcing interaction alternates between operating in parity forcing mode 1 and parity forcing mode 2 in successive global iterations. A PF1Flag value is stored, for example in a register, to differentiate between successive global iterations to enable this alternating treatment. In other embodiments, successive global iterations may be differentiated in other ways. In yet other embodiments, such alternating treatment is omitted. A determination is made whether the PF1Flag value equals zero (block 624). Where the PF1Flag equals zero (block 624), the PF1Flag is set to one and the symbol selective scaling with parity forcing interaction operates in parity forcing mode 1, performing the global processing iteration with symbol selective scaling enabled, generating the LLR values using the number of violated parity checks multiplied by a constant such as −2 or 2 as the decoder input (block 630). Where the PF1Flag does not equal zero (block 624), the PF1Flag is set to zero (block 626) and the symbol selective scaling with parity forcing interaction operates in parity forcing mode 2 (block 632) for the current global processing iteration.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit.

It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system comprising:
   a data detector circuit operable to apply a data detection algorithm to a data input based at least in part on a decoded output to yield a detected output;
   a symbol selective scaling circuit operable to selectively scale one or more symbols of a first data set derived from the detected output to yield a scaled data set; and
   a data decoder circuit operable to apply a data decode algorithm to a second data set derived from the scaled data set to yield the decoded output, wherein the symbol selective scaling circuit is operable to enable selective scaling after the data input has been processed at least once by the data detector circuit and the data decoder circuit.

2. The data processing system of claim 1, wherein the symbol selective scaling circuit is operable to select the first data set based at least in part on a parity forcing mode in the data processing system.

3. The data processing system of claim 2, wherein the parity forcing mode is determined based at least in part on a number of violated parity checks in the second data set.

4. The data processing system of claim 3, wherein a first parity forcing mode is selected when the number of violated parity checks is above a first threshold, a second parity forcing mode is selected when the number of violated parity checks is between the first threshold and a second threshold, and a third parity forcing mode is selected when the number of violated parity checks is below the second threshold.

5. The data processing system of claim 2, wherein symbol selective scaling is applied by the symbol selective scaling circuit in all parity forcing modes.

6. The data processing system of claim 2, wherein the symbol selective scaling circuit is operable to vary the selection of the first data set between successive global iterations in at least some parity forcing modes.

7. The data processing system of claim 2, wherein the symbol selective scaling circuit is operable to select as the first data set a scaled version of the detected output.

8. The data processing system of claim 2, wherein the symbol selective scaling circuit is operable to alternately select as the first data set in successive global iterations a scaled version of the detected output or the detected output minus a soft output of the data decoder circuit.

9. The data processing system of claim 2, wherein the symbol selective scaling circuit is operable to alternately select as the first data set in successive global iterations a scaled version of the detected output or a parity forced signal based on a number of violated parity checks in the second data set multiplied by a scaling factor.

10. The data processing system of claim 1, wherein the data decoder circuit comprises a low density parity code decoder.

11. The data processing system of claim 1, wherein the data processing system is implemented as an integrated circuit.

12. The data processing system of claim 1, wherein the data processing system is incorporated in a storage device.

13. The data processing system of claim 1, wherein the data processing system is incorporated in a storage system comprising a redundant array of independent disks.

14. The data processing system of claim 1, wherein the data processing system is incorporated in a transmission system.

15. A method of processing data, comprising:
- applying a data detection algorithm to a data input based at least in part on a decoded output to yield a detected output;
- selectively scaling one or more symbols of a first data set derived from the detected output to yield a scaled data set; and
- applying a data decode algorithm to a second data set derived from the scaled data set to yield the decoded output, wherein the one or more symbols of the first data set are selectively scaled after the data detection algorithm and the data decode algorithm have been applied at least once.

16. The method of claim 15, wherein the selective scaling is applied in each of a plurality of parity forcing modes while processing the data.

17. The method of claim 16, wherein one of the parity forcing modes is selected for each global detection and decoding iteration based at least in part on a number of violated parity checks in the decoded output.

18. The method of claim 16, wherein the first data set is derived from the detected output in a varying fashion between successive global iterations in at least some parity forcing modes.

19. The method of claim 15, wherein based at least in part on a number of violated parity checks in the decoded output, the second data set is derived from at least one of the detected output, the detected output minus the decoded output, and the number of violated parity checks.

20. A storage device comprising:
- a storage medium;
- a head assembly disposed in relation to the storage medium and operable to provide a sensed signal corresponding to information on the storage medium;
- a read channel circuit including:
- an analog to digital converter circuit operable to sample an analog signal derived from the sensed signal to yield digital samples;
- an equalizer circuit operable to equalize the digital samples to yield equalized data;
- a data detector circuit operable to apply a data detection algorithm to the equalized data based at least in part on a decoded output to yield a detected output;
- a symbol selective scaling circuit operable to selectively scale one or more symbols of a first data set derived from the detected output to yield a scaled data set; and
- a data decoder circuit operable to apply a data decode algorithm to a second data set derived from the scaled data set to yield the decoded output, wherein the symbol selective scaling circuit is operable to enable selective scaling after the equalized data has been processed at least once by the data detector circuit and the data decoder circuit.

* * * * *